(12) United States Patent
Pham

(10) Patent No.: US 10,985,435 B2
(45) Date of Patent: Apr. 20, 2021

(54) TUNABLE PROBE FOR HIGH-PERFORMANCE CROSS-COUPLED RF FILTERS

(71) Applicant: The Boeing Company, Chicago, IL (US)

(72) Inventor: Tai Pham, El Segundo, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/041,504

(22) Filed: Jul. 20, 2018

(65) Prior Publication Data
US 2020/0028230 A1    Jan. 23, 2020

(51) Int. Cl.
| | | |
|---|---|---|
| *H01P 1/208* | (2006.01) | |
| *H01P 7/10* | (2006.01) | |
| *H01P 1/20* | (2006.01) | |
| *H03H 7/01* | (2006.01) | |

(52) U.S. Cl.
CPC .......... *H01P 1/2084* (2013.01); *H01P 1/2002* (2013.01); *H01P 7/10* (2013.01); *H03H 7/0138* (2013.01); *H03H 7/0169* (2013.01)

(58) Field of Classification Search
CPC ......... H01P 1/2002; H01P 1/2084; H01P 7/10
USPC ................................. 333/206–209
See application file for complete search history.

(56) References Cited

U.S. PATENT DOCUMENTS

| | | | |
|---|---|---|---|
| 4,216,448 A | 8/1980 | Kasuga et al. | |
| 4,672,342 A * | 6/1987 | Gartzke | H01R 24/542 |
| | | | 333/260 |
| 6,211,755 B1 * | 4/2001 | Kubota | H01P 7/10 |
| | | | 333/219.1 |
| 6,559,740 B1 | 5/2003 | Schulz et al. | |
| 7,697,915 B2 | 4/2010 | Behzad et al. | |
| 2004/0108919 A1 | 6/2004 | Snyder | |
| 2010/0090785 A1 * | 4/2010 | Panariello | H01P 1/2053 |
| | | | 333/209 |
| 2012/0286901 A1 | 11/2012 | Vangala | |
| 2015/0035612 A1 | 2/2015 | Maxim et al. | |
| 2015/0084713 A1 | 3/2015 | Maxim et al. | |

FOREIGN PATENT DOCUMENTS

| | | |
|---|---|---|
| CN | 101098033 A | 1/2008 |
| CN | 103296359 A | 9/2013 |
| DE | 2218277 A1 | 10/1973 |
| EP | 0930666 A1 | 7/1999 |
| EP | 1895615 A1 | 3/2008 |

OTHER PUBLICATIONS

Search Report for related European Application No. 19183289.8; report dated Nov. 19, 2019.

* cited by examiner

*Primary Examiner* — Rakesh B Patel
(74) *Attorney, Agent, or Firm* — Miller, Matthias & Hull LLP

(57) ABSTRACT

A tunable probe includes a first resonator, a second resonator spaced from the first resonator, and a cross-couple extending from the first resonator to the second resonator. The cross-couple includes a first substrate and a second substrate disposed between the first and second resonator to create a capacitance between the first and second resonators. The cross-couple further includes a wire connecting the first and second substrates and a dielectric surrounding the wire.

20 Claims, 3 Drawing Sheets

US 10,985,435 B2

TUNABLE PROBE FOR HIGH-PERFORMANCE CROSS-COUPLED RF FILTERS

TECHNICAL FIELD

The present disclosure generally relates to tunable probes, such as band-pass filters, for use in radio frequency (RF) applications.

BACKGROUND

Communications systems utilize various filters to allow or inhibit signals selectively with varying frequency. Typically, noise or unwanted frequencies are inhibited or blocked and the desired signal is allowed to pass through for processing. Some band pass filters are constructed using elements that resonate.

One type of communication system, satellite communication systems, utilize microwave communications frequencies that range from 1-30 Gigahertz (GHz). Additional goals of many satellite-based communication system components are to reduce weight in order to reduce costs associated with launching a satellite into orbit and to utilize approved components for space technology. Developing communication materials that utilize approved materials, have a reduced weight, and provide the correct signal processing characteristics is a challenge.

SUMMARY OF THE DISCLOSURE

In one aspect of the present disclosure, a tunable probe includes a first resonator, a second resonator spaced from the first resonator, and a cross-couple extending from the first resonator to the second resonator. The cross-couple includes a first substrate and a second substrate disposed between the first and second resonators to create a capacitance between the first and second resonators. The cross-couple further includes a wire connecting the first and second substrates and a dielectric surrounding the wire.

In another aspect of the invention, a cross-couple for a tunable probe includes a first substrate and a second substrate, the first and second substrates both having a first portion and a second portion. A wire connects the first portion of the first and second substrates and a dielectric surrounds the wire. In one embodiment, the first portion is a metallic portion and the second portion is an alumina substrate portion.

In another aspect of the invention, a method of tuning a tunable probe is provided. In such a method, a cross-couple is disposed between a first resonator and a second resonator. The cross-couple includes a first substrate and a second substrate disposed between the first and second resonators to create a capacitance between the first and second resonators, a wire connecting each of the first and second substrates, and a dielectric surrounding the wire. The method further includes adjusting a position of the cross-couple along a lateral axis between the first and second resonators and bonding the cross-couple in place between the first and second resonators. Additional aspects are defined by the claims of this patent.

DETAILED DESCRIPTION

Figure 1:
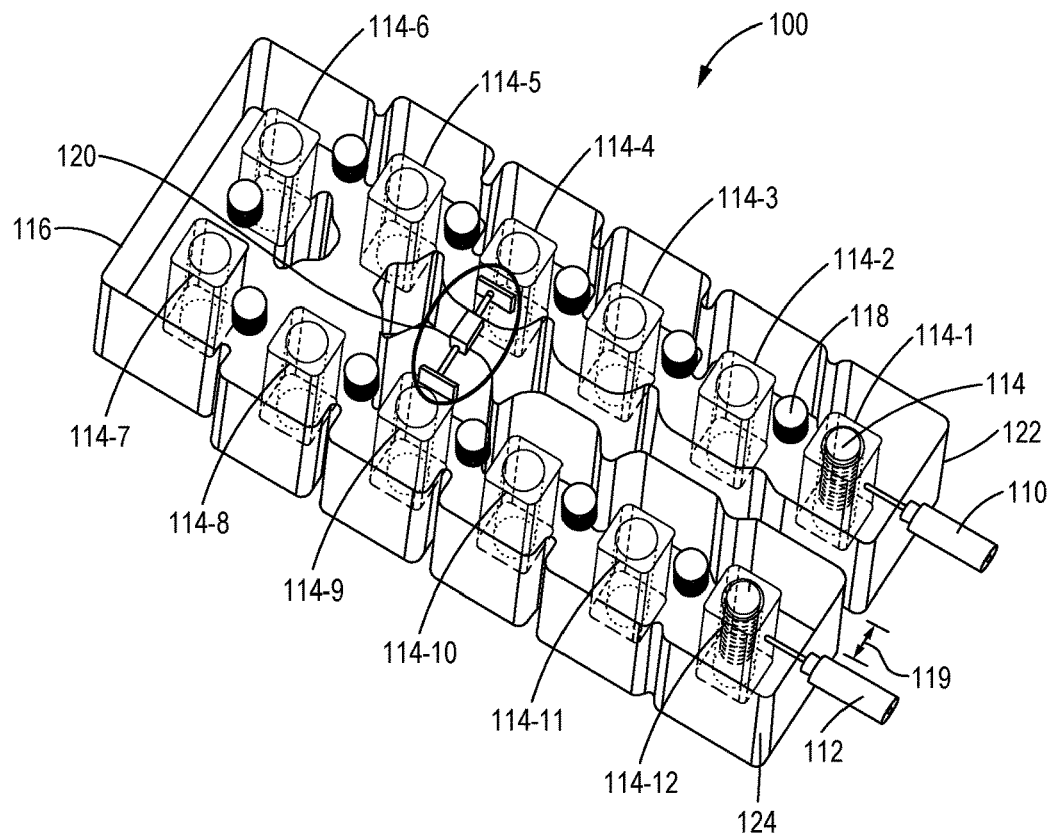
FIG. 1 is an isometric view of a first tunable probe in accordance with an embodiment of the present disclosure.

FIG. 1 is an isometric view of a first tunable probe in accordance with an embodiment of the present disclosure. In particular, FIG. 1 depicts the tunable probe 100 that includes a tunable-probe inlet 110 and a tunable-probe outlet 112 connected to the housing 116. The tunable probe 100 may be connected into a communication system via the tunable probe inlet 110 and outlet 112 in order to provide filtering characteristics to the radio frequency (RF) signals in the communication system. The housing 116 includes a gap 119 between a first arm 122 and a second arm 124. The tunable probe 100 may also include various tunable screws 118 disposed about the housing between the resonators 114.

The tunable probe 100 further includes a plurality of resonators 114. As used throughout the description, the positions of the resonators are indicated by a suffix after the resonator number (e.g., the '6' in '114-6' indicates a sixth resonator position). Thus, in FIG. 1, the tunable probe 100 includes twelve (12) resonators 114. A resonator 114 may be realized by a cylindrical-shaped cavity within the housing 116. A resonator 114 is included at a first resonator position 114-1 within the housing 116 adjacent to the tunable-probe inlet 110. In accordance with the numbering convention, the resonator positions increase incrementally in a counter-clockwise direction along the housing 116, starting at the tunable-probe inlet 110. Thus, proceeding in a counter-clockwise direction, the next resonator position after the first resonator position 114-1 is the second resonator position 114-2. The convention continues through to the twelfth (and final) resonator position 114-12 adjacent to the tunable-probe outlet 112.

In accordance with an embodiment, a tunable probe 100 includes a first resonator 114 spaced apart from the second resonator 114. For example, the first resonator 114 may be at the fourth resonator position 114-4 and the second resonator 114 may be at the ninth resonator position 114-9, which is spaced apart and across from the first resonator 114. A cross-couple 120 extends from the first resonator 114 to the second resonator 114. The cross-couple 120 is discussed in more detail in conjunction with the discussion of FIG. 2.

In general, the resonators 114 in a tunable probe are grouped in pairs. For example, the tunable probe 100 includes six pairs of resonators 114. Each of the six pairs include two resonators 114 located opposite of each other. A first pair includes the resonators 114 located at the first resonator position 114-1 and the twelfth resonator position 114-12. The sixth pair includes the resonators 114 located at the sixth resonator position 114-6 and the seventh resonator position 114-7. As discussed later in the description, one method of improving signal processing capabilities of a tunable probe is to increase the number of pairs of resonators 114 within the housing 116. However, this method results in excess material in a larger housing. Another method is to include a cross-couple between a pair of resonators, such as the cross-couple 120. At higher frequencies, a conductive wire may be able to provide sufficient capacitance to provide the desired signal processing characteristics. However, at frequencies under 4 GHz, the capacitance of a just a conductive wire may not be sufficient to achieve the desired response.

Figure 2:
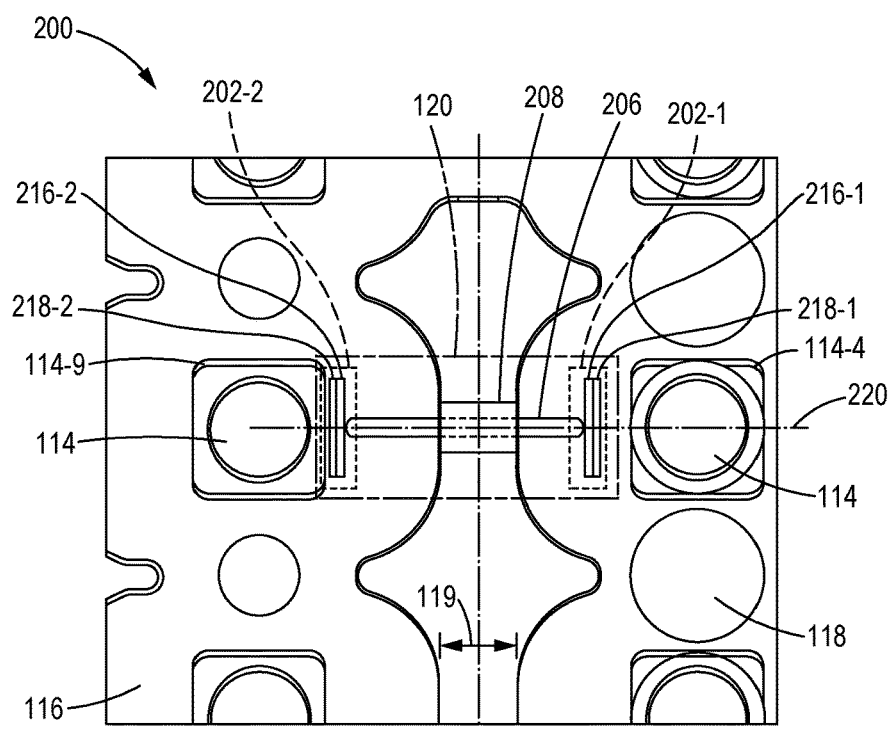
FIG. 2 is a detailed view of a cross-couple section of the first tunable probe depicted in FIG. 1, in accordance with an embodiment of the present disclosure.

FIG. 2 is a detailed view of a cross-couple of the first tunable probe depicted in FIG. 1, in accordance with an embodiment of the present disclosure. In particular, FIG. 2 depicts the view 200, which is a top-view of a portion of the tunable probe 100 and details aspects of the cross-couple 120. The cross-couple 120 includes a first substrate 202-1 in proximity to the first resonator 114 located at resonator position 114-4 and a second substrate 202-2 in proximity to the second resonator 114 located at resonator position 114-9. The cross-couple 120 is disposed between the first and second resonators 114 to create a capacitance between the first and second resonators 114. A wire 206 connects the first and second substrates 202-1, 202-2. A dielectric 208 surrounds the wire 206. In some embodiments, the wire 206 is a silver wire, although certainly other conductive materials such as copper, gold, or the like may be used. The dielectric 208 also prevents the wire 206 from shorting against the housing 116.

In some embodiments, the first and second resonators 114 are disposed in the housing 116. A space between the first arm 122 and the second arm 124 defines a gap 119. The wire 206 extends across the gap 119 to define an exposed wire portion, and the dielectric 208 surrounds the exposed wire portion.

In some embodiments, the tunable probe 100 is configured to operate in either one or both of the X and L microwave communication/radio/frequency bands having a frequency range between 8-12 GHz and 1-2 GHz, respectively. At such frequency ranges, the capacitance of a conductive wire alone utilized as a cross-couple between a pair of resonators 114 is insufficient to create the desired filtering performance of the tunable probe. In order to provide sufficient capacitance, the cross-couple 120, extending between two resonators 114, includes a first substrate 202-1 and a second substrate 202-2 connected via the wire 206. The first substrate 202-1 is located in proximity to the first resonator 114 at the fourth resonator position 114-4 and the second substrate 202-2 is located in proximity to the second resonator 114 at the ninth resonator position 114-9. In some such embodiments, the material of the first and second substrates 202-1, 202-2 are selected to have a material permittivity ($\varepsilon_r$, and also illustrated as Er) between 9.5 and 10.0. One such material may include alumina substrate.

As further detailed in FIG. 2, the first substrate 202-1 and the second substrate 202-2 may both include a first portion 216-1 and 216-2, respectively, and a second portion 218-1 and 218-2, respectively. The wire 206 connects the first portion 216-1 of the first substrate 202-1 with the first portion 216-2 of the second substrate 202-2. In some embodiments, the second portion (218-1, 218-2) is oriented towards a respective resonator (114, 314) comprising the first resonator or the second resonator. As such, the second portion 218-1 of the first substrate 202-1 is oriented towards (e.g., is located adjacent to or facing) the first resonator 114 on a side opposite of the first portion 216-1 as the wire 206. Similarly, the second portion 218-2 of the second substrate 202-2 is oriented towards (e.g., is located adjacent to) the second resonator 114 on a side opposite of the first portion 216-2 as the wire 206. In various embodiments, the material of the first portion 216-1, 216-2 is metallic (e.g., silver, gold) and the material of the second portion 218-1, 218-2 is selected based on a desired material permittivity (e.g., alumina substrate).

The first portion 216-1, 216-2 of the first and second substrates 202-1, 202-2 may be rectangular and have a length and a width dimension. Further, the second portion 218-1, 218-2 of the first and second substrates 202-1, 202-2 may also be rectangular and have a length and a width dimension the same as the first portion 216-1, 216-2. The size (e.g., the cross-sectional area) of the first portion 216-1, 216-2 and the second portion 218-1, 218-2 may be selected based on desired filtering parameters of the tunable probe 100. In addition to rectangles, the sizes of the first portion 216-1, 216-2 and the second portion 218-1, 218-2 may be also be circular, oval, or the like.

In constructing the first and second substrates 202-1, 202-2, an inner surface of the first portion 216-1, 216-2 is affixed to the wire 206. Example methods of affixing to the first portions to the wire 206 include bonding with epoxy, soldering, and the like. An outer surface, opposite the inner surface, of the first portion 216-1, 216-2 is affixed to the second portion 218-1, 218-2. Example methods of affixing the first portions to the second portions include bonding with epoxy, folding edges of the first portion 216-1, 216-2 about the second portion to partially enclose and mechanically capture the second portion 218-1, 218-2, and the like. In some embodiments, the substrates 202-1, 202-2 include the second portion 218-1, 218-2 affixed directly to the wire 206 without the first portion 216-1, 216-2.

In some embodiments, the tunable probe 100 is tunable at least in part by adjusting a location of the dielectric 208 along a lateral axis 220. The lateral axis 220 extends between the first and second resonators 114 and may be parallel to a longitudinal axis of the wire 206. The dielectric 208 is fixed (e.g., bonded with epoxy) to the wire 206 at the determined, based on the desired tuning, location along the lateral axis 220 between the first and second resonators 114.

The housing 116 may further include a recess in each arm 122, 124 along the lateral axis 220. The recesses are configured to receive a portion of the dielectric 208 to permit translation of the dielectric 208 along the lateral axis 220 to assist in tuning of the tunable probe 100. In addition to bonding the dielectric 208 to the wire 206, a portion of the dielectric 208 may also be bonded to the housing 116 at the recesses.

Figure 3:
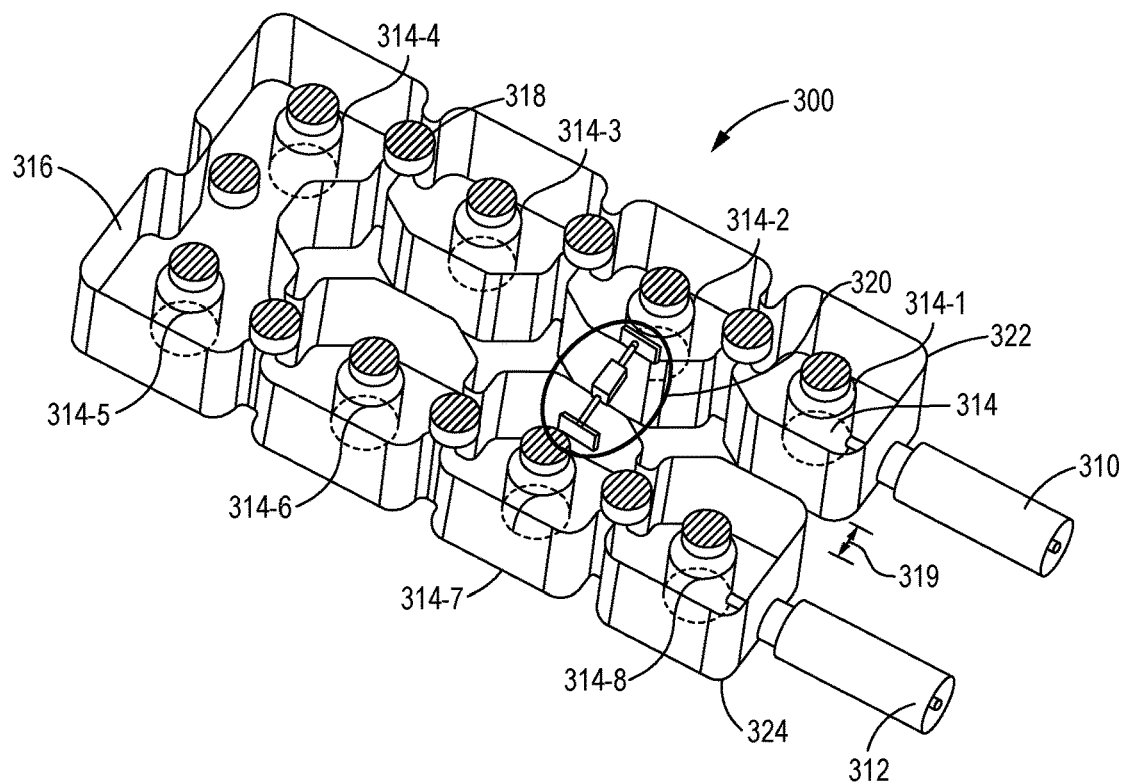
FIG. 3 is an isometric view of a second tunable probe in accordance with an embodiment of the present disclosure.

FIG. 3 is an isometric view of a second tunable probe in accordance with an embodiment of the present disclosure. In particular, FIG. 3 depicts an isometric view of the tunable probe 300. The tunable probe 300 is similar to the tunable probe 100 discussed in conjunction with FIG. 1. While the tunable probe 100 comprises a total of twelve resonators 114, with the cross-couple 120 extending between the resonators at the fourth resonator position 114-4 and the ninth resonator position 114-9, other configurations are likewise achievable. For example, the tunable probe 300 includes eight resonators, with a cross-couple extending between the resonators at the second and seventh positions.

The components of the tunable probe 300 are similar to like-numbered components of the tunable probe 100, with the tunable probe 300 including a tunable-probe inlet 310, a tunable probe outlet 312, a plurality of resonators 314, and a housing 316 having a first arm 322 and a second arm 324. The first and second arms 322, 324 define a gap 319. A cross-couple 320 is disposed between the first resonator 314 and a second resonator 314. As compared to the tunable probe 100, a first difference is that the tunable probe 300 includes 8 resonators 314 (as compared to 12 resonators 114 of the tunable probe 100). A second difference is that the cross-couple 320 extends between the first resonator 314 located at the second resonator position 314-2 and the second resonator 314 located at the seventh resonator position 314-7 (as compared to the cross-couple 120 extending between resonators 114 at the fourth and ninth resonator positions of the tunable probe 100).

Figure 4:
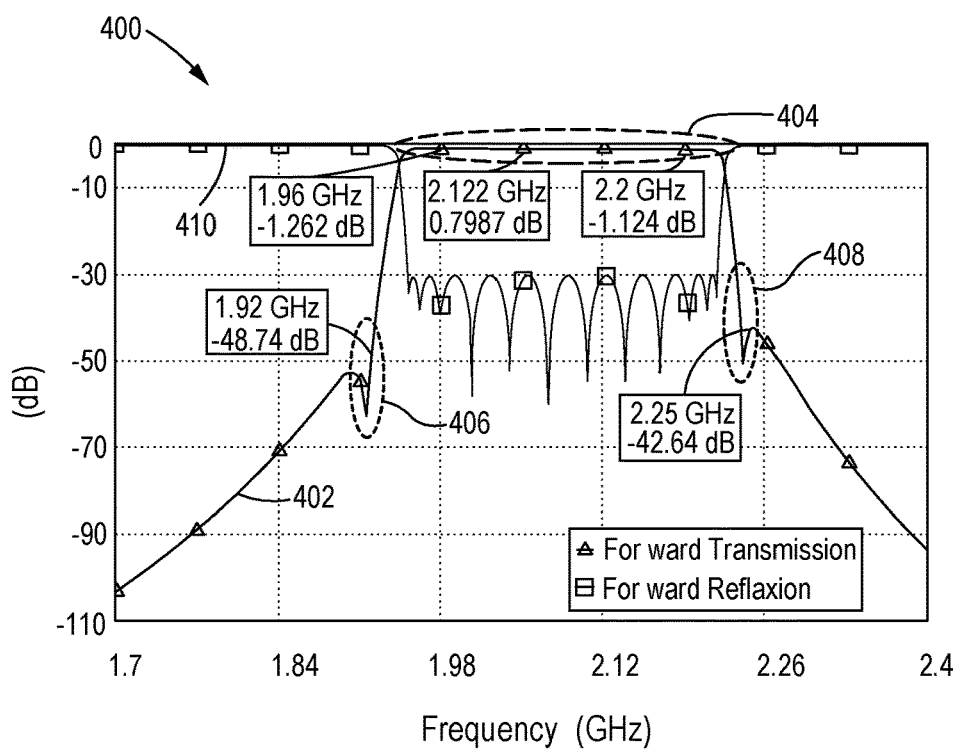
FIG. 4 is a chart of signal processing characteristics of a tunable probe, in accordance with an embodiment of the present disclosure.

FIG. 4 is a chart of signal processing characteristics of a tunable probe, in accordance with an embodiment of the present disclosure. In particular, FIG. 4 is a chart 400 that depicts the filtering characteristics of the tunable probe 100. In the chart 400, the vertical axis depicts signal level, measured in decibels (dB). The horizontal axis depicts frequency of the communications signal, measured in GHz. The curve 402 depicts forward transmission and the curve 410 depicts forward reflection, as measured across the tunable-probe inlet 110 and the tunable-probe outlet 112 at each of the different frequencies.

As exemplified by the forward transmission curve 402, the tunable probe 100 acts as a band-pass filter centered around approximately 2 GHz. This is indicated by the band pass region 404 having a 0 dB measurement between 1.96 GHz and 2.2 GHz. A first notch 406 is located at a frequency just below the band pass region 404 (e.g., 1.92 GHz). A second notch 408 is located at a frequency just above the band pass region 404 (e.g., 2.25 GHz). Outside of the band pass region 404, the value of the forward transmission curve 402 drops off steeply. This occurs at frequencies at and below the first notch 406 (e.g., 1.92 GHz) and at frequencies at and above the second notch 408 (e.g., 2.25 GHz). The placement of the cross-couple 120 extending between the first and second resonators causes the notches 406, 408 in the forward transmission curve 402. The steepness (e.g., slope of forward transmission curve 402) of the notches 406, 408 is determined at least in part on the lateral position of the dielectric 208 along the lateral axis 220 and the sizes of the substrates 202-1, 202-2.

Figure 5:
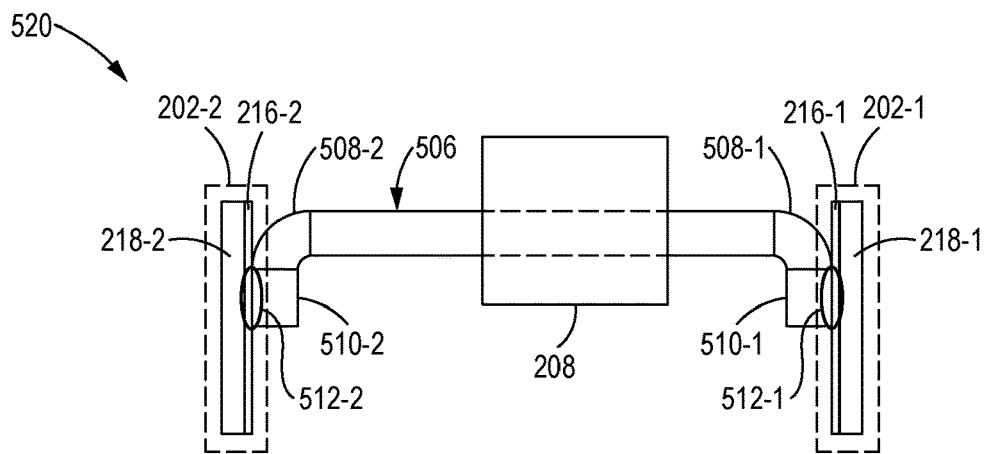
FIG. 5 depicts a cross-couple, in accordance with an embodiment of the present disclosure.

FIG. 5 depicts a cross-couple, in accordance with an embodiment of the present disclosure. In particular, FIG. 5 depicts the cross-couple 520, that may be similar to, and used in the place of, the cross-couples 120 and 320 disclosed herein. The cross-couple 520 includes the first and second substrates 202-1, 202-2, the dielectric 208, and a wire 506. The first and second substrates 202-1, 202-2 each include the first portions 216-1, 216-2 that are near the wire 506 and the second portions 218-1, 218-2 that are opposite of the first portions 216-1, 216-2 and are configured to be oriented towards a resonator (e.g., 114, 314). The wire 506 is similar to the wire 206 and further includes bends 508-1, 508-2 and attachment portions 510-1, 510-2 on each end of the wire 506.

To assemble the cross-couple 520, an initially straight and unbent piece of wire is inserted through a bore hole of the dielectric 208. A forming tool is used to bend the wire to introduce the bends 508-1, 508-2 and attachment portions 510-1, 510-2 into the initially straight and unbent piece of wire. Alternatively, the wire may initially include one bend 508 and one attachment portion 510 on a first end of the wire, with the second end of the wire being straight and unbent. After the second end of the wire is inserted through a bore in the dielectric 208, the second end of the wire may be bent to introduce the second bend 508 and the second attachment portion 510.

The first and second substrates 202-1, 202-2 are attached to the respective attachment portions 510-1, 510-2 on the respective ends of the wire 506. The attachment portions 510-1, 510-2 are essentially perpendicular to the first and second substrates 202-1, 202-2 and provide an increased surface area to attach the substrates 202-1, 202-2 to the wire 506. Example methods to attach the wire 506 to the substrates 202-1, 202-2 at the attachment portions 510-1, 510-2 include soldering and gold-epoxying the pieces together at a mating surface 512-1, 512-2.

As part of tuning the probe (e.g., 100), the cross-couple 520 may be inserted into the housing (e.g., 116) along a lateral axis between a pair of resonators (e.g., along the lateral axis 220). The wire 506 is bonded to the dielectric 208 at the determined location to tune the probe (e.g., adjust the slope of the notches at either end of the band-pass region).

INDUSTRIAL APPLICABILITY

The teachings of the present disclosure have wide uses throughout industry. In one non-limiting example, the tunable probe 100 is utilized in a satellite-based communication system as a band-pass filter, operating in either one of the X and L bands. In such an example, one engineering objective is to manufacture the tunable probe out of materials approved for use in satellite communication systems. Another engineering objective is to reduce the overall weight and size of the tunable probe. A final engineering objective is to have the tunable probe permit communication frequencies of approximately X or L frequency band to pass through while attenuating frequencies outside of a band pass region.

While the tunable probe 100 is used in the following example, any other suitable tunable probe (e.g., the tunable probe 300, a tunable probe with a different number of resonators or different location of the cross-couple) may be used.

The tunable probe 100 includes components manufactured from an approved list of materials. For example, the wire 206 is manufactured from silver, and the second portions 218-1, 218-2 of the respective substrates 202-1, 202-2 are manufactured from alumina substrate. The cross-couple 120 extends between the first resonator 114 located in the fourth resonator position 114-4 and the second resonator 114 located in the ninth resonator position 114-9. The alumina substrate in the cross-couple 120 provides sufficient capacitance between the first and second resonators 114 in order to provide the appropriate notches 406, 408 at either end of the band pass region 404. The tunable probe 100 is further able to be tuned, as described in conjunction with FIG. 6.

Figure 6:
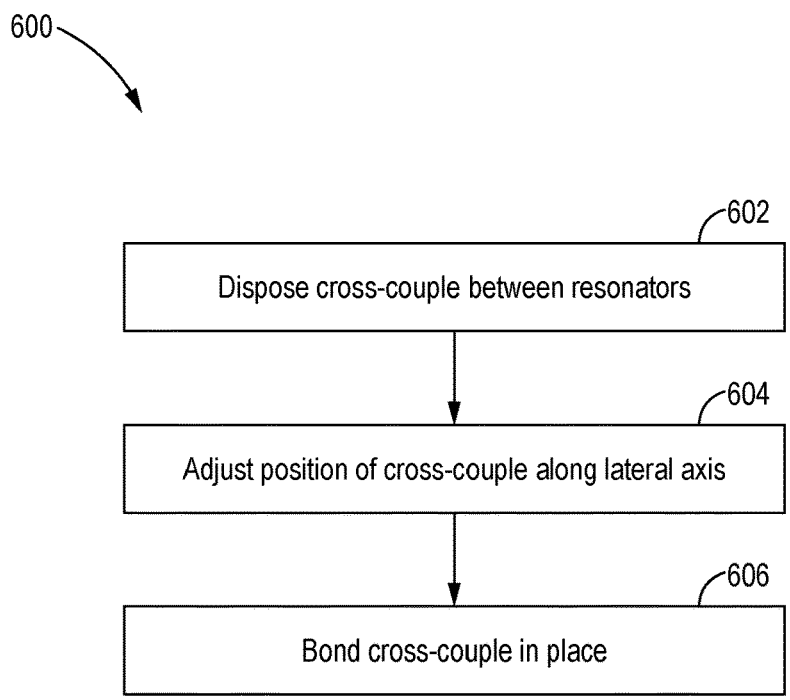
FIG. 6 is a method of tuning a tunable probe, in accordance with an embodiment of the present disclosure.

FIG. 6 is a method of tuning a tunable probe, in accordance with an embodiment of the present disclosure. In particular, FIG. 6 depicts the method 600 that includes disposing a cross-couple between resonators at block 602, adjusting the position of the cross-couple along the lateral axis at block 604, and bonding the cross-couple in place at block 606.

By way of example, the tunable probe 100 may be used in order to perform the method 600, although any of the other tunable probes and cross-couples disclosed herein may similarly be used to perform the method 600. In such an example at block 602, the cross-couple 120 is disposed between the first and second resonators 114, such as between the resonators at the fourth 114-4 and ninth 114-9 resonator positions. The cross-couple 120 may be any cross-couple described herein, and includes a first and a second substrate 202-1, 202-2 connected by a wire 206, with a dielectric 208 surrounding the wire 206.

At block 604, a position of the cross-couple 120 is adjusted along the lateral axis 220 between the first and second resonators 114. At block 606, the cross-couple 120 is bonded in place, at the adjusted position, between the first and second resonators 114.

While the preceding text sets forth a detailed description of numerous different embodiments, it should be understood that the legal scope of protection is defined by the words of the claims set forth at the end of this patent. The detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims defining the scope of protection.

It should also be understood that, unless a term was expressly defined herein, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to herein in a manner consistent with a single meaning, that is done for sake of clarity only so as to not confuse the reader, and it is not intended that such claim term be limited, by implication or otherwise, to that single meaning.

What is claimed is:

1. A tunable filter comprising:
   a first resonator;
   a second resonator spaced from the first resonator; and
   a cross-couple extending from the first resonator to the second resonator, the cross-couple comprising:
      a first substrate and a second substrate, the first and second substrates disposed between the first and second resonators to create a capacitance between the first and second resonators, the first and second substrates having a material permittivity (Er) between 9.5 and 10.0;
      a wire connecting the first and second substrates; and
      a dielectric surrounding the wire.

2. The tunable filter of claim 1, wherein:
   the tunable filter comprises eight resonators;
   the first resonator is at a second resonator position; and
   the second resonator is at a seventh resonator position, opposite of the second resonator position.

3. The tunable filter of claim 1, wherein the first and second substrates comprise an alumina substrate.

4. The tunable filter of claim 1, wherein the tunable filter is configured to operate in either one or both of the X and L frequency bands.

5. The tunable probe filter of claim 1, wherein the tunable probe filter is a band pass filter configured to pass a frequency of 2 GHz.

6. The tunable filter of claim 1, wherein the first and second substrates comprise both a metallic portion bonded to the wire and an alumina substrate portion facing a respective resonator comprising the first resonator or the second resonator.

7. The tunable filter of claim 1, wherein:
   the first and second resonators are disposed in a housing defining a gap;
   the wire extends across the gap to define an exposed wire portion; and
   the dielectric surrounds the exposed wire portion.

8. The tunable filter of claim 1, wherein the wire comprises a silver wire.

9. The tunable filter of claim 1, wherein tuning the tunable filter comprises adjusting a location of the dielectric along a lateral axis and bonding the dielectric to the wire between the first and second resonators.

10. The tunable filter of claim 1, wherein tuning the tunable filter comprises selecting a size of the first and second substrates.

11. The tunable filter of claim 1, wherein:
   the tunable filter comprises twelve resonators;
   the first resonator is at a fourth resonator position; and
   the second resonator is at a ninth resonator position, opposite of the fourth resonator position.

12. A cross-couple for a tunable filter, the cross-couple comprising:
   a first substrate and a second substrate, the first and second substrates having both a first portion and a second portion, the second portion comprising and alumina substrate;
   a wire connecting the first portion of the first and second substrates; and
   a dielectric surrounding the wire.

13. The cross-couple of claim 12, wherein the dielectric is bonded to the wire with epoxy.

14. The cross-couple of claim 12, wherein the cross-couple is configured to be disposed between a first and second resonator to create a capacitance between the first and second resonators.

15. The cross-couple of claim 14, wherein tuning the tunable filter comprises positioning the cross-couple along a lateral axis between the first and second resonators.

16. The cross-couple of claim 14, wherein the second portion of each of the first and second substrates is oriented towards a respective resonator comprising the first resonator or the second resonator.

17. The cross-couple of claim 12, wherein the first and second substrates comprise the alumina substrate, the alumina substrate having a material permittivity (Er) between 9.5 and 10.0.

18. The cross-couple of claim 12, wherein the first and second substrates are bonded to the wire with epoxy.

19. A method of tuning a tunable filter, the method comprising:
   disposing a cross-couple between a first resonator and a second resonator, the cross-couple comprising:
      a first substrate and a second substrate, the first and second substrates disposed between the first and second resonators to create a capacitance between the first and second resonators, the first and second substrates having a material permittivity (Er) between 9.5 and 10.0;
      a wire connecting each of the first and second substrates; and
      a dielectric surrounding the wire;
   adjusting a position of the cross-couple along a lateral axis between the first and second resonators; and
   bonding the cross-couple in place between the first and second resonators.

20. The method of claim 19, wherein:
   the first and second substrates comprise both a first portion and a second portion;
   the second portion comprising an alumina substrate; and
   the second portion of each of the first and second substrates is oriented towards a respective resonator comprising the first resonator or the second resonator.

* * * * *

UNITED STATES PATENT AND TRADEMARK OFFICE
CERTIFICATE OF CORRECTION

PATENT NO. : 10,985,435 B2  
APPLICATION NO. : 16/041504  
DATED : April 20, 2021  
INVENTOR(S) : Tai Pham Page 1 of 1

It is certified that error appears in the above-identified patent and that said Letters Patent is hereby corrected as shown below:

In the Claims

At Column 7, Line 54, delete the word "probe"

Signed and Sealed this  
Seventeenth Day of August, 2021

Drew Hirshfeld  
*Performing the Functions and Duties of the*  
*Under Secretary of Commerce for Intellectual Property and*  
*Director of the United States Patent and Trademark Office*